United States Patent
Lee et al.

(10) Patent No.: US 8,852,992 B2
(45) Date of Patent: Oct. 7, 2014

(54) METHOD OF MANUFACTURING SOLAR CELL

(75) Inventors: Woo-Su Lee, Yongin-si (KR); Sang-Cheol Park, Seoul (KR); Byoung-Dong Kim, Asan-si (KR); Jung-Gyu Nam, Suwon-si (KR); Gug-Il Jun, Hwaseong-si (KR); Dong-Gi Ahn, Seoul (KR); In-Ki Kim, Seoul (KR)

(73) Assignees: Samsung SDI Co., Ltd., Yongin-Si, Gyeonggi-Do (KR); Samsung Display Co., Ltd., Yongin, Gyeonggi-Do (KR)

( * ) Notice: Subject to any disclaimer, the term of this patent is extended or adjusted under 35 U.S.C. 154(b) by 116 days.

(21) Appl. No.: 13/105,815

(22) Filed: May 11, 2011

(65) Prior Publication Data

US 2011/0287579 A1    Nov. 24, 2011

(30) Foreign Application Priority Data

May 24, 2010 (KR) ........................ 10-2010-0048100

(51) Int. Cl.
  *H01L 21/00* (2006.01)
  *H01L 21/02* (2006.01)
  *H01L 31/032* (2006.01)

(52) U.S. Cl.
  CPC ...... *H01L 31/0322* (2013.01); *H01L 21/02568* (2013.01); *H01L 21/02614* (2013.01); *Y02E 10/541* (2013.01); *H01L 21/02491* (2013.01); *Y02E 10/52* (2013.01)
  USPC .......... 438/84; 438/89; 438/95; 257/E31.008; 257/E31.009

(58) Field of Classification Search
  USPC ......... 257/E31.008, E31.009; 438/84, 89, 95, 438/97
  See application file for complete search history.

(56) References Cited

U.S. PATENT DOCUMENTS

| | | | |
|---|---|---|---|
| 5,045,409 A | 9/1991 | Eberspacher et al. | |
| 6,258,620 B1 | 7/2001 | Morel et al. | |
| 6,307,148 B1 | 10/2001 | Takeuchi et al. | |
| 7,374,963 B2 * | 5/2008 | Basol .............................. | 438/95 |
| 2002/0106873 A1 | 8/2002 | Beck et al. | |
| 2005/0028861 A1 | 2/2005 | Aoki et al. | |

(Continued)

FOREIGN PATENT DOCUMENTS

| | | |
|---|---|---|
| EP | 1 424 735 | 6/2004 |
| JP | 10-150212 | 6/1998 |
| JP | 2000-150938 | 5/2000 |
| JP | 2000-156517 | 6/2000 |

(Continued)

OTHER PUBLICATIONS

US Office Action in U.S. Appl. No. 12/789,591, dated Dec. 19, 2011 (Kim, et al.).

(Continued)

*Primary Examiner* — Robert Huber
(74) *Attorney, Agent, or Firm* — Lee & Morse, P.C.

(57) ABSTRACT

A method of manufacturing a solar cell having increased light efficiency due to increased gallium distribution on a surface of a light absorption layer, the method including forming a first electrode on a substrate, forming a precursor that includes at least one of copper, gallium, and indium on the first electrode, forming a preliminary light absorption layer by providing selenium to the precursor, forming the preliminary light absorption layer further including performing a heat treatment, and forming a liquid state CuSe compound, forming a light absorption layer by providing a compound including at least one of gallium and indium to the preliminary light absorption layer, and forming a second electrode on the light absorption layer.

11 Claims, 6 Drawing Sheets

(56) References Cited

U.S. PATENT DOCUMENTS

| | | |
|---|---|---|
| 2006/0204659 A1 | 9/2006 | Choi |
| 2006/0222558 A1 | 10/2006 | Alberts |
| 2007/0054435 A1* | 3/2007 | Yoon ............................ 438/48 |
| 2007/0257255 A1 | 11/2007 | Dhere et al. |
| 2007/0283998 A1 | 12/2007 | Kuriyagawa et al. |
| 2007/0289624 A1 | 12/2007 | Kuriyagawa et al. |
| 2008/0121277 A1 | 5/2008 | Robinson et al. |
| 2008/0156371 A1 | 7/2008 | LoCascio et al. |
| 2009/0107550 A1* | 4/2009 | Van Duren et al. ........... 136/262 |
| 2010/0029036 A1 | 2/2010 | Robinson et al. |
| 2010/0044676 A1 | 2/2010 | Sargent et al. |
| 2010/0120192 A1 | 5/2010 | Jung et al. |
| 2010/0218813 A1* | 9/2010 | Guha et al. .................... 136/255 |
| 2010/0291758 A1 | 11/2010 | Robinson et al. |
| 2011/0114182 A1 | 5/2011 | Robinson et al. |
| 2011/0129957 A1* | 6/2011 | Kim ............................... 438/84 |

FOREIGN PATENT DOCUMENTS

| | | |
|---|---|---|
| JP | 2004-342678 | 12/2004 |
| JP | 2007-109842 | 4/2007 |
| KR | 10-2005-0013063 | 4/2004 |
| KR | 10-2007-0073170 | 1/2006 |
| KR | 10-2007-0104690 | 4/2006 |
| KR | 10-2008-0009345 | 1/2008 |

OTHER PUBLICATIONS

US Office Action in U.S. Appl. No. 12/789,591, dated May 15, 2013 (Kim, et al.).

Non-Final Office Action in U.S. Appl. No. 12/789,591, dated Oct. 11, 2013 (Kim, et al.).

Final Office Action in U.S. Appl. No. 12/789,591, dated Apr. 10, 2014 (Kim, et al.).

Advisory Action in U.S. Appl. No. 12/789,591, dated Jul. 9, 2014.

\* cited by examiner

METHOD OF MANUFACTURING SOLAR CELL

CROSS-REFERENCE TO RELATED APPLICATION

This application claims priority to and the benefit of Korean Patent Application No. 10-2010-0048100 filed in the Korean Intellectual Property Office on May 24, 2010, the entire content of which is incorporated herein by reference.

BACKGROUND OF THE INVENTION (a) Field of the Invention

The present invention relates to a manufacturing method of a solar cell.

(b) Description of the Related Art

A solar cell is a device that converts solar energy into electrical energy by photoelectric effect.

Today, much attention is paid to the importance of clean energy or next-generation fuel source, driven by increasing discussions about potentially negative effects of fossil fuel and green house effect from $CO_2$ emissions. Discussions about the environmental impact of nuclear power generation and radioactive waste also fuel the general interest in clean energy.

In a solar cell, electric current is generated by two kinds of semiconductors, a P type semiconductor and an N type semiconductor. Typically, solar cells are classified into different kinds according to the material that is used as the light absorption layer.

Generally, the structure of a solar cell includes a front surface transparent conductive film, a PN film, and a rear surface reflecting electrode film that are sequentially deposited on a substrate.

If sunlight is incident on a solar cell having this structure, electrons are collected in an N layer and holes are collected in a P layer, generating electric current.

A compound solar cell (for example: a CIGS compound solar cell) is characterized by the fact that sunlight is converted into electricity without using silicon. A CIGS compound solar cell differs from the well-known silicon-based solar cell and offers a high efficiency. Copper (Cu), indium (In), gallium (Ga) and selenium (Se) compounds are deposited on an electrode that is formed on a flexible substrate, which may be made of stainless steel, aluminum and the like in addition to a glass substrate, to improve efficiency.

When the CIGS (Cu, In, Ga, Se) compound is deposited, evaporation or sputtering may be used.

In order to form the solar cell that has high efficiency, the ratio of copper (Cu), indium (In), and gallium (Ga) in the composition is optimized, crystallinity is increased, and defects between the interfaces are lowered.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a manufacturing method of a CIGS solar cell having high efficiency.

In one aspect, the present invention provides a method of manufacturing a solar cell. The method includes: forming a first electrode on a substrate; forming a precursor that includes at least one of copper, gallium, and indium on a first electrode; forming a preliminary light absorption layer by providing selenium Se to the precursor; forming a light absorption layer by providing a compound including at least one of gallium and indium to the preliminary light absorption layer; and forming a second electrode on the light absorption layer.

The precursor may be formed so that a composition ratio that corresponds to copper/(gallium+indium) is 1 or more.

The forming of the light absorption layer may include providing the compound that includes at least one of gallium and indium by using a chemical vapor deposition method.

The forming of the preliminary light absorption layer may include forming the CIGS compound and the CuSe compound.

The forming of the light absorption layer may include controlling the composition ratio of copper/(gallium+indium) in the light absorption layer to be 1 or less by providing the compound that includes at least one of gallium and indium by using a chemical vapor deposition method.

The forming of the precursor may include forming the first layer that includes a CuGa compound or a CuIn compound on the first electrode; and forming a second layer that includes gallium or indium on the first layer.

The forming of the first layer and the forming of the second layer may use a sputtering method.

The forming of the preliminary light absorption layer by providing selenium Se to the precursor may include heat treatment.

The forming of the preliminary light absorption layer may include forming a CuSe compound in liquid phase.

The forming of the light absorption layer may include forming a CIGS compound by reacting a compound including at least one of gallium and indium that is provided by a chemical vapor deposition method with the CuSe compound.

The forming of the light absorption layer may include heat treatment.

The forming of the light absorption layer may include providing selenium.

The forming of the light absorption layer may form the light absorption layer in which an energy band profile has a double graded band-gap structure by providing a compound that includes gallium by using a chemical vapor deposition method.

The light absorption layer is disposed in a first region that is close to the first electrode, a second region that is close to the second electrode, and a third region that is disposed between the first region and the second region, and the double graded bandgap structure may be formed so that the bandgap in the first region and the second region is larger than the bandgap in the third region.

The compound that includes gallium may include trimethyl gallium.

The first electrode may be formed of a reflective metal.

The second electrode may be formed of a transparent conductive material.

The method of the solar cell may further include forming a buffer layer between the light absorption layer and the second electrode.

According to an exemplary embodiment of the present invention, it is possible to form the light absorption layer that has a double graded bandgap structure by injecting the gallium compound at a latter half step of a selenization process.

Accordingly, it is possible to form the high efficiency CIGS solar cell.

Figure 1:
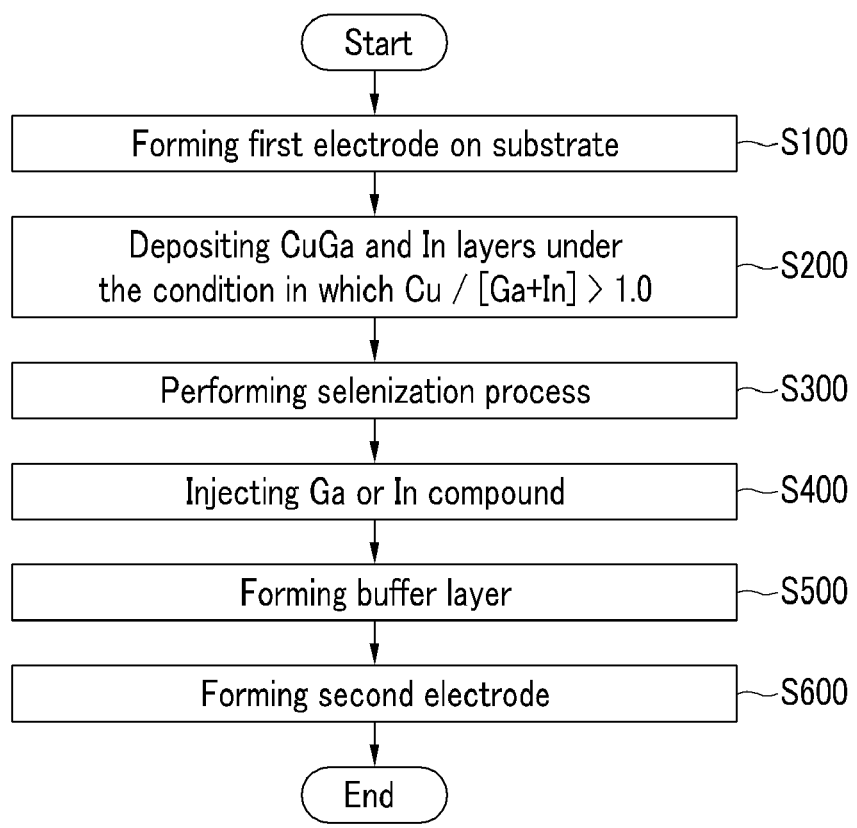
FIG. 1 is a flowchart that illustrates a method of manufacturing a solar cell according to an exemplary embodiment of the present invention.

<Description of Reference Numerals Indicating Primary Elements in the Drawings>

| | | | |
|---|---|---|---|
| 10 | Substrate | 20 | First electrode |
| 30 | First layer | 40 | Second layer |
| 31 | Preliminary light absorption layer | 31a | CIGS compound layer |
| 31b | CuSe compound layer | 32 | Light absorption layer |
| 32a | CIGS crystal layer | 60 | Buffer layer |
| 70 | Second electrode | P | Precursor |

DETAILED DESCRIPTION OF THE EMBODIMENTS

Hereinafter, the present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

The exemplary embodiments that are disclosed herein are provided in order to sufficiently transmit the spirit of the present invention.

The size and thickness of layers and regions may be exaggerated for better comprehension and ease of description in the drawings.

In the case where the layer is mentioned to be "on" another layer or substrate, it may be directly formed on the other layer or substrate or a third layer may be interposed between them.

Like reference numerals designate like components throughout the specification.

FIG. 1 is a flowchart that illustrates a manufacturing method of a solar cell according to an exemplary embodiment of the present invention.

With reference to FIG. 1, the first electrode is formed on a substrate (for example a glass substrate, a ceramic substrate, a metal substrate), by using any suitable conventional technique (S100). The first electrode may be formed of a metal material that can reflect light.

A copper gallium (CuGa) compound and indium (In) are sequentially deposited on the first electrode, for example by using a sputtering method (S200).

The copper gallium (CuGa) compound and indium (In) are herein referred to as a precursor, which may be formed so that the composition ratio copper/(gallium+indium) is 1.0 or more.

The precursor is then heat treated. While the precursor is heat treated, selenium is supplied so that a selenization process takes place (S300).

During the selenization process is performed, the supplied selenium reacts with the precursor P to form the CIGS compound, and copper that remains after the CIGS compound is formed is combined with selenium (Se) to form a CuSe compound.

The CIGS compound and the CuSe compound form a preliminary light absorption layer 31.

The CuSe compound, which is in liquid phase, may help the growth of a crystal by filling spaces between a preliminary light absorption layer surface and CIGS grain boundary.

In addition, the CuSe compound is electrically conductive. Hence, when it remains in the solar cell, it acts as a shunt path, such that it should be ultimately removed.

In the latter half of the selenization process, a compound that includes gallium or indium (S400) is introduced.

The supplying of selenium may be stopped upon the introduction of the compound that includes gallium or indium, and only the compound that includes gallium or indium may be injected.

The injection of a compound including gallium or indium may deposit gallium or indium on the preliminary light absorption layer by using chemical vapor deposition (CVD).

The deposition of gallium or indium may be performed by using a MOCVD (Metal-Organic Chemical Vapor Deposition) technique.

The CIGS compound is formed by injecting the compound that includes gallium or indium and combining the CuSe compound with the CIS compound ($CuIn_3Se_5$) that is formed on the surface of the CuSe compound.

A buffer layer is formed on the light absorption layer (S500).

The second electrode is formed on the buffer layer (S600).

The second electrode may be formed of a material that has good light transmittance and electric conductivity.

Additionally, an upper substrate may be formed on the second electrode.

FIG. 2 to FIG. 8 are cross-sectional views that illustrate a method of manufacturing a solar cell according to an exemplary embodiment of the present invention.

Hereinafter, a method of manufacturing a solar cell according to an exemplary embodiment of the present invention will be described in detail with reference to FIGS. 2 to 8.

Figure 2:
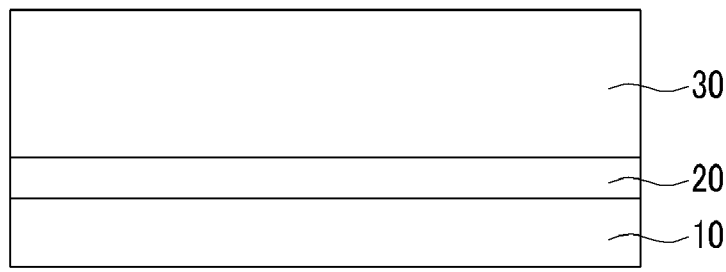
FIG. 2 to FIG. 8 are cross-sectional views that illustrate a method of manufacturing a solar cell according to an exemplary embodiment of the present invention.

With reference to FIG. 2, the first electrode 20 is formed on the substrate 10.

The substrate 10 may contain a ceramic, a metal such as stainless steel, or an amorphous material such as glass.

The first electrode 20 may be formed of a reflective conductive metal such as aluminum, copper, and molybdenum.

The first layer 30 is formed by depositing the compound of copper gallium (CuGa) on the first electrode 20, for example by using the sputtering technique.

In an exemplary embodiment of the present invention, the first layer 30 is formed of the compound of copper gallium (CuGa), but the first layer 30 may be formed of the compound of copper indium (CuIn) in another exemplary embodiment.

Figure 3:
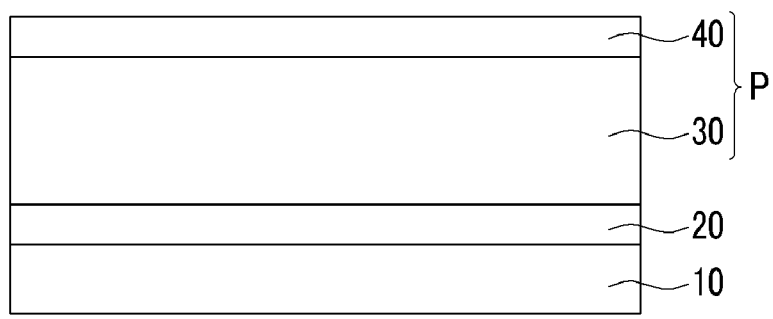

With reference to FIG. 3, the second layer 40 is formed by depositing gallium (Ga) or indium (In) on the first layer 30, for example by using a sputtering method.

Herein, the first layer 30 and the second layer 40 form the precursor P to the light absorption layer.

According to an exemplary embodiment of the present invention, the precursor P that includes the first layer 30 and the second layer 40 is formed so that the composition ratio copper/(gallium+indium) is 1 or more.

That is, the precursor P is formed to have excess copper (Cu) as compared to gallium (Ga) and indium (In).

Figure 4:
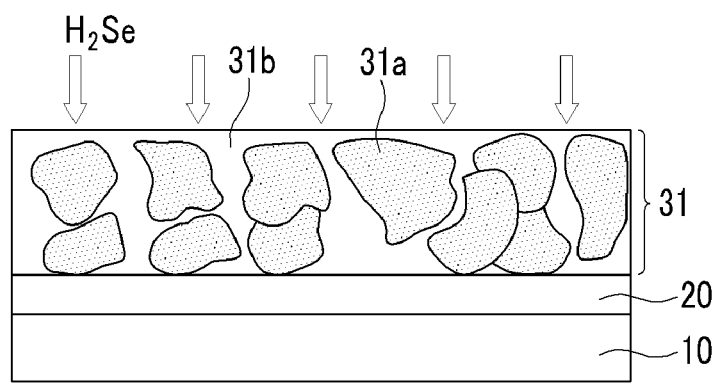

With reference to FIG. 4, the preliminary light absorption layer 31 is formed by providing selenium Se while the precursor P is being heat treated. In detail, selenium Se that is provided while the precursor P is heat treated reacts with copper Cu, gallium Ga, and indium In in the precursor P to form the CIGS compound layer 31a and the CuSe compound layer 31b. Hence, the preliminary light absorption layer 31 includes the CIGS compound layer 31a and the CuSe compound layer 31b.

The heat treatment temperature may be about 400° C. to 600° C.

The CuSe compound layer 31b is in liquid state at this high temperature range and fills the spaces in the CIGS compound layer 31a.

In this case, the space at the interface between the first electrode 20 and the CIGS compound layer 31a may be filled with the CuSe compound.

Figure 5:
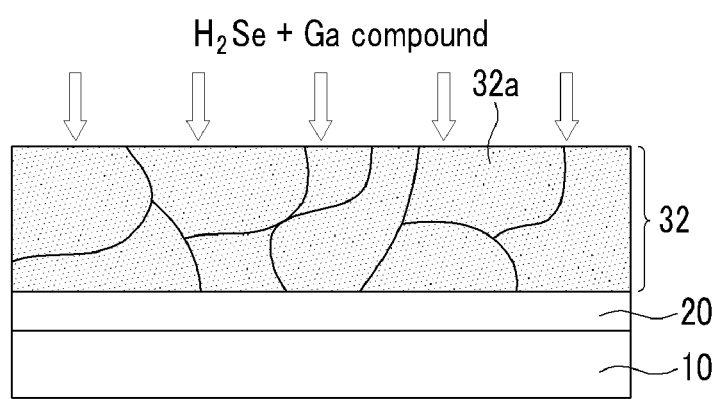

Referring to FIG. 5, a compound including gallium Ga is provided on the preliminary light absorption layer 31 by using a chemical vapor deposition method.

Although only the case of a compound that includes gallium is illustrated, the compound may include indium instead of gallium.

According to an exemplary embodiment of the present invention, the composition ratio of copper/(gallium+indium) in the light absorption layer that is ultimately formed may be 1 or less. The amount of gallium or indium that is provided to the preliminary light absorption layer 31 may be controlled to achieve the desired composition ratio.

In the CIGS solar cell, the composition ratio of copper/(gallium+indium) can result in an optimum efficiency of around 0.9.

While the compound that includes gallium is being supplied, the heat treatment may be performed and selenium Se may be additionally provided.

The compound that includes gallium provided by using the chemical vapor deposition method, the CIGS compound that is included in the preliminary light absorption layer 31, and the CuSe compound are reacted to form the light absorption layer 32.

Figure 6:
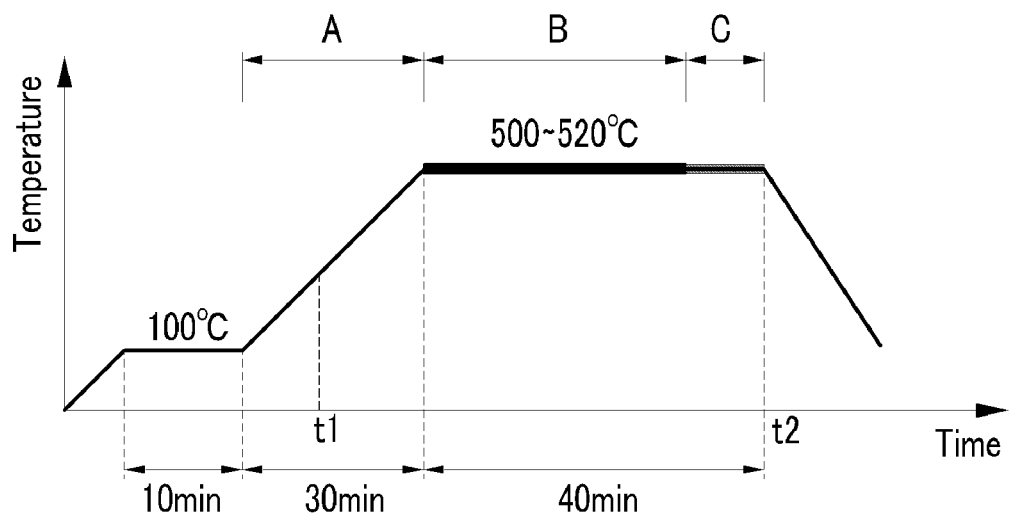

FIG. 6 is a graph that illustrates a change in temperature as a function of time in the process that is described with reference to FIG. 4 and FIG. 5.

With reference to FIG. 6, the heat treatment is performed under the hydrogen selenide ($H_2Se$) atmosphere, and it approaches a time t1 at which thermal decomposition of hydrogen selenide starts.

Approximately 30 minutes into the area A that includes the time t1 at which thermal decomposition of hydrogen selenide starts, the process enters area B. In area B, a temperature in the range of 500 to 520° C. is maintained and, as shown in FIG. 3, the precursor P and selenium Se react with each other to form a preliminary light absorption layer 31.

In the area B, while the temperature of 500 to 520° C. is maintained, selenium (Se) is supplied.

When the preliminary light absorption layer 31 is sufficiently formed, the compound that includes gallium or indium is provided to the preliminary light absorption layer 31 by using the CVD method in area C of FIG. 6. The compound that includes gallium may be trimethyl gallium.

When the preliminary light absorption layer 31 is sufficiently formed, upon the addition of the compound that includes gallium or indium, the added compound reacts with the CuSe compound to form the light absorption layer 32.

Particularly, the CIS compound ($CuIn_3Se_5$) that does not include gallium exists in a large amount on the surface of the preliminary light absorption layer 31 instead of the CIGS compound. When the compound that includes gallium is added after the preliminary light absorption layer 31 is sufficiently formed, the CIS compound is converted into the CIGS compound, such that the gallium distribution on the surface of the light absorption layer 32 is increased.

Figure 7:
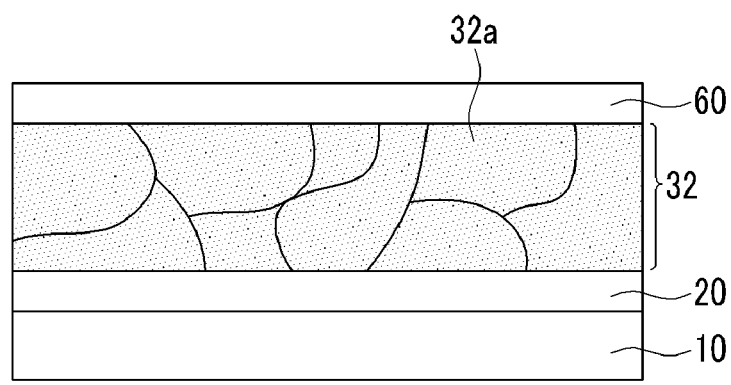

With reference to FIG. 7, the buffer layer 60 is formed on the light absorption layer 32.

The buffer layer 60 is formed at the PN junction to reduce the differences in the lattice constants and energy bandgaps between the P type semiconductor and the N type semiconductor.

Accordingly, the energy band value of the material that is used in the buffer layer 60 may be a middle value between the energy bandgap values of the N type semiconductor and the P type semiconductor.

The buffer layer 60 may be formed of CdS, Zn(O, S, OH), In(OH)xSy, ZnInxSey, ZnSe and the like.

Figure 8:
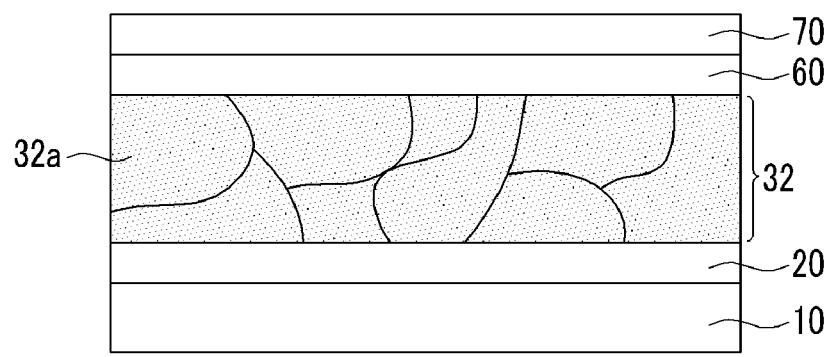

With reference to FIG. 8, the second electrode 70 is formed on the buffer layer 60.

The second electrode 70 may be the N type semiconductor and formed of a transparent conductive material. For example, the second electrode 70 may be formed of ZnO:Al.

Although not shown in the drawings, an upper substrate may be formed on the second electrode 70.

In an exemplary embodiment of the present invention, the first electrode 20 is a reflective electrode and the second electrode 70 is a transparent electrode, but the present invention may be applied to the case where the first electrode 20 is the transparent electrode and the second electrode 70 is the reflective electrode.

Figure 9:
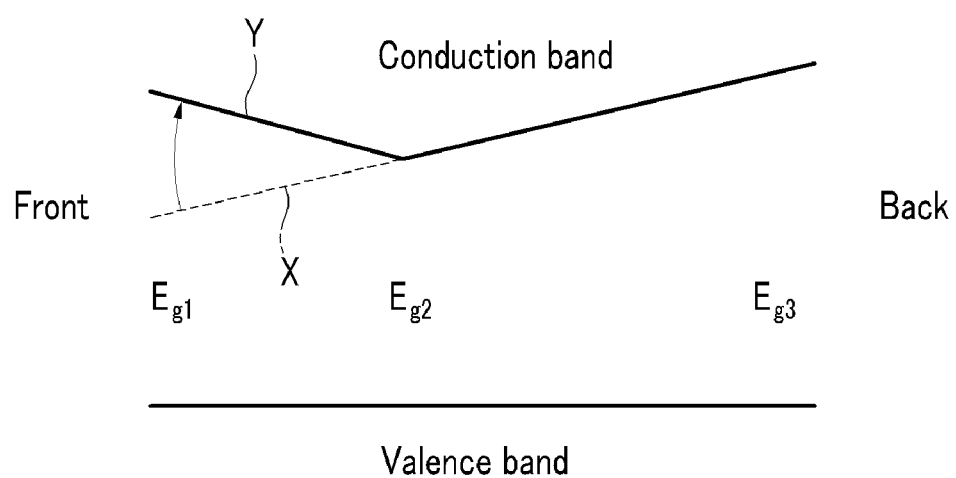
FIG. 9 is a schematic diagram that illustrates an energy band of a light absorption layer that is formed by using a manufacturing method of a solar cell according to an exemplary embodiment of the present invention.

FIG. 9 is a schematic diagram that illustrates an energy band of a light absorption layer that is formed by using a manufacturing method of a solar cell according to an exemplary embodiment of the present invention.

With reference to FIG. 9, the front portion is a region of the light absorption layer 32 that is close to the second electrode 70 and the back portion means a region of the light absorption layer 32 that is close to the first electrode 20 in FIG. 8.

In the manufacturing method of the solar cell according to an exemplary embodiment of the present invention, after the compound that includes gallium when the preliminary light absorption layer 31 is sufficiently formed, the CIS compound that exists in a large amount on the surface of the preliminary light absorption layer 31 is converted into the CIGS compound to increase the gallium distribution on the surface of the light absorption layer 32.

As a result, the straight line that shows the bandgap is changed from the first straight line (X) to the second straight line (Y).

The first bandgap Eg1, the second bandgap Eg2 and the third bandgap Eg3 that show the bandgap have correlations of Eg1>Eg2 and Eg3>Eg2.

In other words, it is possible to improve the short wavelength absorption ratio by increasing the bandgap of a region of the light absorption layer 32 that is close to the second electrode 70, and it is possible to increase light efficiency by moving electrons from a region of the light absorption layer 32 that is close to the second electrode 70 to the light absorption layer 32 that is close to the first electrode 20 and reducing its ratio to the holes.

As described above, the manufacturing method of the solar cell according to an exemplary embodiment of the present invention, when the precursor that includes copper, gallium, indium is formed, provides copper in an excessive amount, and when the compound that includes gallium or indium is added by using the CVD method, it is possible to control the final composition ratio of copper, gallium, and indium.

In addition, when the preliminary light absorption layer is sufficiently formed, it is possible to form the double grade bandgap structure by adding the compound that includes gallium to increase the gallium distribution on the surface of the light absorption layer.

Accordingly, it is possible to increase light efficiency of the solar cell that is manufactured according to an exemplary embodiment of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a solar cell, the method comprising:
   forming a first electrode on a substrate;
   forming a precursor on the first electrode, wherein the precursor includes:
      a first layer that includes a CuGa compound or a CuIn compound on the first electrode, and
      a second layer that includes gallium or indium on the first layer,
      wherein a composition ratio of copper/(gallium+indium) in the precursor is 1 or more;
   heating the precursor while adding selenium to form a preliminary light absorption layer including a Cu, In, Ga, Se compound and liquid CuSe;
   continuing the heating while adding selenium and while adjusting the composition ratio of copper/(gallium+indium) to be about 1 or less by providing a compound including at least one of gallium and indium to the liquid CuSe in the preliminary light absorption layer to form a light absorption layer; and
   forming a second electrode on the light absorption layer.

2. The method of claim 1, wherein:
   the forming of the first layer and the forming of the second layer use a sputtering method.

3. The method of claim 1, wherein:
   the forming of the light absorption layer includes forming a Cu, In, Ga, Se compound, and the compound including at least one of gallium and indium is provided by a chemical vapor deposition method.

4. The method of claim 1, wherein the light absorption layer has an energy band profile having a double graded band-gap structure.

5. The method of claim 4, wherein:
   the light absorption layer is disposed in a first region that is close to the first electrode, a second region that is close to the second electrode, and a third region that is disposed between the first region and the second region,
   the double graded bandgap structure is formed so that the bandgap in the first region and the second region is larger than the bandgap in the third region.

6. The method of claim 5, wherein:
   the compound including at least one of gallium and indium includes trimethyl gallium.

7. The method of claim 4, wherein:
   the forming of the first layer and the forming of the second layer use a sputtering method.

8. The method of claim 4, wherein:
   the forming of the light absorption layer includes forming a Cu, In, Ga, Se compound, and the compound including at least one of gallium and indium is provided by a chemical vapor deposition method.

9. The method of claim 1, wherein:
   the first electrode is formed of a reflective metal.

10. The method of claim 1, wherein:
    the second electrode is formed of a transparent conductive material.

11. The method of claim 1, further comprising:
    forming a buffer layer between the light absorption layer and the second electrode.

* * * * *